United States Patent [19]

Patel

[11] 4,359,772
[45] Nov. 16, 1982

[54] DUAL FUNCTION ERROR CORRECTING SYSTEM

[75] Inventor: Arvind M. Patel, San Jose, Calif.

[73] Assignee: International Business Machines Corporation, Armonk, N.Y.

[21] Appl. No.: 206,779

[22] Filed: Nov. 14, 1980

[51] Int. Cl.³ .............................................. G06F 11/10
[52] U.S. Cl. ...................................... 371/39; 371/38
[58] Field of Search ............................ 371/39, 37, 38

[56] References Cited

U.S. PATENT DOCUMENTS

| | | | |
|---|---|---|---|
| 3,487,362 | 12/1969 | Frey, Jr. | 371/39 |
| 3,638,182 | 1/1972 | Burton et al. | 371/39 |
| 3,742,449 | 6/1973 | Blair | 371/39 |
| 3,755,779 | 8/1973 | Price | 371/38 |
| 3,859,630 | 1/1975 | Bennett | 371/39 |

OTHER PUBLICATIONS

A. M. Patel, Dual-Function ECC Employing Two Check Bytes per Word, IBM Technical Disclosure Bulletin, vol. 24, No. 2, Jul. 1981, pp. 1002–1004.

Primary Examiner—Charles E. Atkinson
Attorney, Agent, or Firm—R. E. Cummins

[57] ABSTRACT

A dual function cyclic code error correcting method and system are disclosed for correcting from a single syndrome byte a random single-bit error which occurs in a multi-byte data word or, alternatively, correcting a multi-bit error in one byte of the data word by providing an indication of the location of the byte in error, and employing the same syndrome byte to determine the error pattern of the multi-bit error so the multi-bit error can be corrected.

The method involves non-zero syndrome processing steps which comprise a first series of steps which function to determine if the non-zero syndrome correlates to a 1-bit error in one of the byte positions of the data word being protected, and if so, to automatically correct the single-bit error by processing the entire byte containing the single-bit error. If no correlation of the syndrome byte is established with a single-bit error, then the byte position in the data word of the multi-bit error is used during a second series of steps to process the same non-zero syndrome byte to determine the pattern of the multi-bit error in the defective byte so that the pattern can be employed to correct the defective byte.

The method and apparatus disclosed also identify the location of repetitive multi-byte errors by generating a byte parity vector for each data word and using these byte parity vectors to identify the location in each data word of repetitive errors of the multi-bit type.

37 Claims, 13 Drawing Figures

FIG. 1

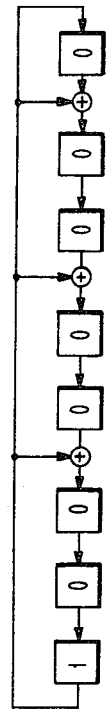
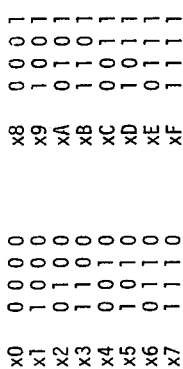
FIG.3
FIG.2
FIG.1A

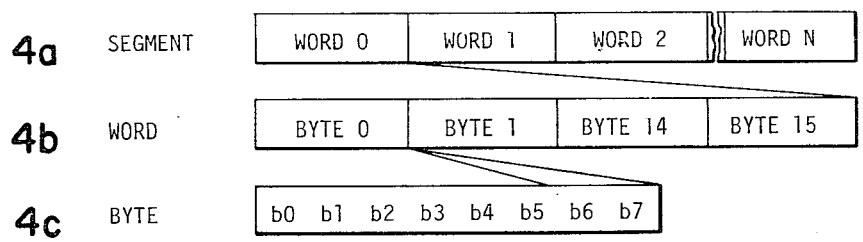
FIG. 4
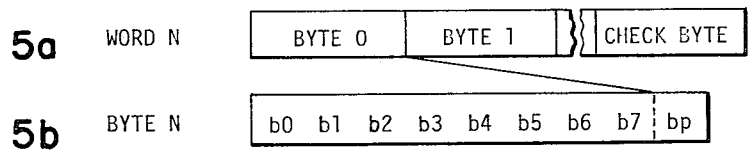
FIG. 5
| SEGMENT | WORD | S | BYTE PARITY VECTOR | ERROR PATTERN |
|---------|------|---|--------------------|---------------|
|         |      |   |                    |               |
|         |      |   |                    |               |
|         |      |   |                    |               |
|         |      |   |                    |               |
|         |      |   |                    |               |
|         |      |   |                    |               |
|         |      |   |                    |               |
|         |      |   |                    |               |
|         |      |   |                    |               |
|         |      |   |                    |               |
ERROR LOG
FIG. 8

DUAL FUNCTION ERROR CORRECTING SYSTEM

DESCRIPTION

BACKGROUND OF THE INVENTION

Cyclic code error correcting systems for correcting random single-bit errors in a data word are well known in the art. The operation of cyclic codes is an extension of the basic Hamming code and can be explained from several perspectives. One accepted explanation involves a parity check table, such as that shown in FIG. 1, which involves a table having K rows and a maximum of $2^K-1$ columns. In the table of FIG. 1, there are eight rows and, hence, a maximum of 255 columns. If the X's in the table are replaced with binary 1's and the blanks in the table by binary 0's, a $255\times 8$ binary matrix H is established which has the capability of detecting, locating and correcting single-bit errors which might occur in any one of the 255 sequential bit positions if a parity check bit is generated for each row from bit positions designated by an X in the table or a 1 in the matrix H.

In the table shown in FIG. 1, the rows have been labelled P0 through P7 starting from the bottom of the table, and the 255 bit positions labelled D0 through D246 and C247 through C254 moving from right to left. Bit positions C247 through C254 are assigned to a generated check character which is used to "protect" a string of 246 data bits that is stored in an environment which might cause one bit of the 255 to be in error when the data is operated on. Typically, the check character is generated again as the data is read from the storage. The newly generated check character is compared, or exclusive-OR'd with the previously generated check character to produce what is generally known in the art as a syndrome character S consisting of bits S0 through S7. An all-zero syndrome byte indicates no error, while a non-zero syndrome byte indicates either a single-bit error, the location of which is defined by the pattern of the non-zero syndrome byte, or an uncorrectable error. This can be readily seen in the parity check table of FIG. 1 since each column represents a unique syndrome byte pattern which will be generated when a single-bit error occurs in the data bit located at the corresponding bit position in the data stream.

In theory, the rules for generating or constructing the parity check table merely require that each column of the table be unique. From a mathematical perspective, each row of the parity check table can be written as a logical equation so that the modulo-2 sum of all bit positions containing an X is equal to 0. The group of eight rows, from a mathematical perspective, represent eight independent, simultaneous equations.

The use of the mathematical perspective assists in simplifying the implementation of a parity check table or matrix in actual hardware since the selection and arrangement of the various permutations of bit values can be accomplished in a more systematic manner. For example, the columns of the parity check matrix represent all possible permutations of eight bits except the all-zero pattern. As mentioned previously, the sequence of the permutations can be arbitrary, and the non-zero syndrome byte will still identify the location of the bit position in error. A linear 8-bit binary counter may provide all of the necessary permutations, but the art has shown that such an implementation involves the problem of certain check bits not being in their final state at the time that they are being checked by other check bits. The prior art, therefore, suggests the use of a maximal length sequence generator, such as the feedback shift register shown in FIG. 2, to implement the function of a parity check table. As is further taught in the art, the feedback connections can be defined mathematically by one of many polynomials. The output of each stage of the maximal length sequence generator or feedback shift register corresponds to an m-sequence. The sequence defined by any row of the table shown in FIG. 1 can also be expressed as a polynomial type equation, as shown in FIG. 2 where the initial status of the shift register contains the "x10" pattern, as shown.

The output of each stage of the feedback shift register can be used to simply sample the value of each data bit position and each parity bit position and the result accumulated modulo-2 to generate the check characters C247 through C254.

An article by the inventor appearing in the IBM *Journal of Research and Development*, Vol. 24, No. 1, January 1980, also discloses check character generators which employ premultiplier matrices $T^\lambda$ which function similarly to conventional feedback shift registers.

Feedback shift register implementations are generally used for generating the check character during the write process and the readback process, and a simple exclusive-OR function is generally employed in generating the syndrome byte. Various arrangements, such as a table lookup scheme or an arrangement for shifting the feedback shift register while counting the number of shifts until a pattern has developed in the shift register which matches the syndrome pattern, are employed for locating or determining the bit position in error. Various implementations based on the above two general concepts have been widely disclosed in the prior art.

It is also well known that the capability of the matrix H represented by the parity check table of FIG. 1 can be increased such that with a single syndrome byte, double errors can be detected (but not corrected) in addition to correcting single-bit errors.

Also, it has been recognized that a single syndrome byte can perform more than two purposes, such as correction of single-bit errors and detection of some multi-bit errors. It should be apparent that the function of correcting any type of error necessarily implies the ability to detect that error and also to locate such an error in order for it to be corrected.

It is also generally well known that the correcting capability of a parity check matrix can be increased by adding additional check bytes and generating corresponding syndrome bytes for the same set of data bits. However, the use of additional check bytes implies less efficiency of the code or higher costs. For example, if the code is to protect stored data, the storage capacity of the memory for user data is decreased. A similar decrease in efficiency occurs when a code word requiring several check bytes is used to protect a data word being transmitted from a receiver to a transmitter through a communication channel, since the channel is functionally equivalent to a memory in many respects.

The selection of a matrix H for error correcting purposes is based to a large extent on the knowledge of the type of errors that can be expected and the relationship of the possibility of each type of error occurring. These parameters change drastically depending on the particular environment or application to which the error correcting system is applied. The capability or power of the code is also chosen based on the resulting consequences of particular types of errors not being detectable or correctable. Overlying all of the above considerations is the ability to implement the detecting, locating, and correcting functions in hardware that is economical and corresponds in operating speed to the system to which it is applied.

DUAL FUNCTION ECC ENVIRONMENTS

The storage of large amounts of binary data in a bubble memory system has become of interest because of the volumetric or space efficiency of bubble memories relative to conventional magnetic storage. In addition, bubble memory systems have an advantage over conventional semiconductor memories in that they are nonvolatile and, therefore, are similar to magnetic storage memories in this respect. The storage efficiency of a bubble memory, for example, permits a memory chip having 150 minor loops, each of which has approximately 750 bit positions, to be constructed on a chip only 5 mm×5 mm in dimension. A group of such chips can be packaged in a bubble memory module which then provides a plurality of parallel output signals, and the module is only 25 mm×25 mm in dimension.

While the rate at which data can be written into or out of a bubble memory chip or module is relatively slow compared to conventional dynamic magnetic memories, a number of modules can be multiplexed or operated in parallel to obtain any desired data rate comparable to conventional disk or tape drive type storage devices.

When such a system is configured, it becomes readily apparent to those skilled in the art that some type of single-bit error correcting system must be employed because of the inherent characteristics of a bubble memory chip to generate random 1-bit errors during operation of the bubble memory. It will also be recognized by persons skilled in the bubble chip technology that the nonvolatility of the bubble memory chip is not inherent in the same sense that data stored on a magnetic surface is nonvolatile, since the ability to readily read data out of a chip is dependent on the ability to step both the major and minor loops. When that ability is lost, the net effect is that the data bits stored in that chip are lost, just as if it were a volatile memory.

In addition, there is always a non-zero probability of a chip or module failing. Such an occurrence is a catastrophic failure and must be protected against in any practical system where a considerable amount of data is stored on the module and otherwise would be lost without any means of retrieving it.

It will also be apparent to those skilled in the bubble memory art that it is not economically practical to manufacture a bubble chip in which all of the minor loops are perfect, so that in practice it is necessary to configure the bubble memory system so that certain known defective minor loops in each chip are not used. Where the chips are packaged nine chips to a module and the system configured such that an 8-bit byte is stored in a module, the ninth chip or ninth bit position can serve different functions. One such function may be the conventional parity bit for the 8-bit byte to check the integrity of each byte. The ninth bit position of the module can also be used in place of a defective bit position in one of the other chips provided that none of the other eight chips have a bad minor loop in the corresponding minor loop position. Further, it will be appreciated that using the ninth bit position of the module as a partity bit when all the minor loops at the same position are operative and sacrificing the parity bit position to store a data bit at those positions where one known minor loop is defective would be advantageous from a system standpoint, provided a suitable error correcting system is provided for detecting, locating and correcting a 1-bit error which might occur in a byte position which is not provided with the ninth bit parity.

The present invention is directed to a dual function ECC method and system for protecting against such conditions, namely, random single-bit errors (first function) and repetitive multi-bit errors in a predefined contiguous sequence of bits, such as a byte (second function). While the improved ECC method and system are disclosed as applied to a bubble memory system, the method and system are equally applicable to other applications, including data communications, having similar error-fault characteristics.

Applicant's co-pending commonly assigned application Ser. No. 206,778 filed concurrently herewith discloses another dual function error correcting system for correcting random single bit errors and repetitive multi-bit errors in a byte.

BRIEF DESCRIPTION OF THE DRAWINGS

FIG. 1 is a prior art parity check table comprising 255 bit positions; FIG. 1a is a chart showing the 4-bit binary representations in hexadecimal notation for hex characters x0 through xF employed in part of the table of FIG. 1;

FIG. 2 is a prior art feedback shift register for generating a maximum length sequence corresponding to the parity check table in FIG. 1;

FIG. 3 is a parity check table developed from FIG. 1 employed with the present invention;

FIGS. 4a through 4c illustrate respectively the segment, word, and byte formats for the information which is processed by the present invention;

FIGS. 5a and 5b illustrate respectively the position of the check byte CK in each data word and the position of the parity bit P' in each byte which is employed to generate a byte parity vector used in the correction of multi-bit errors;

FIG. 8 is a chart illustrating the type of data that is stored in the error history log in FIG. 6.

DESCRIPTION OF THE INVENTION

Figure 6:
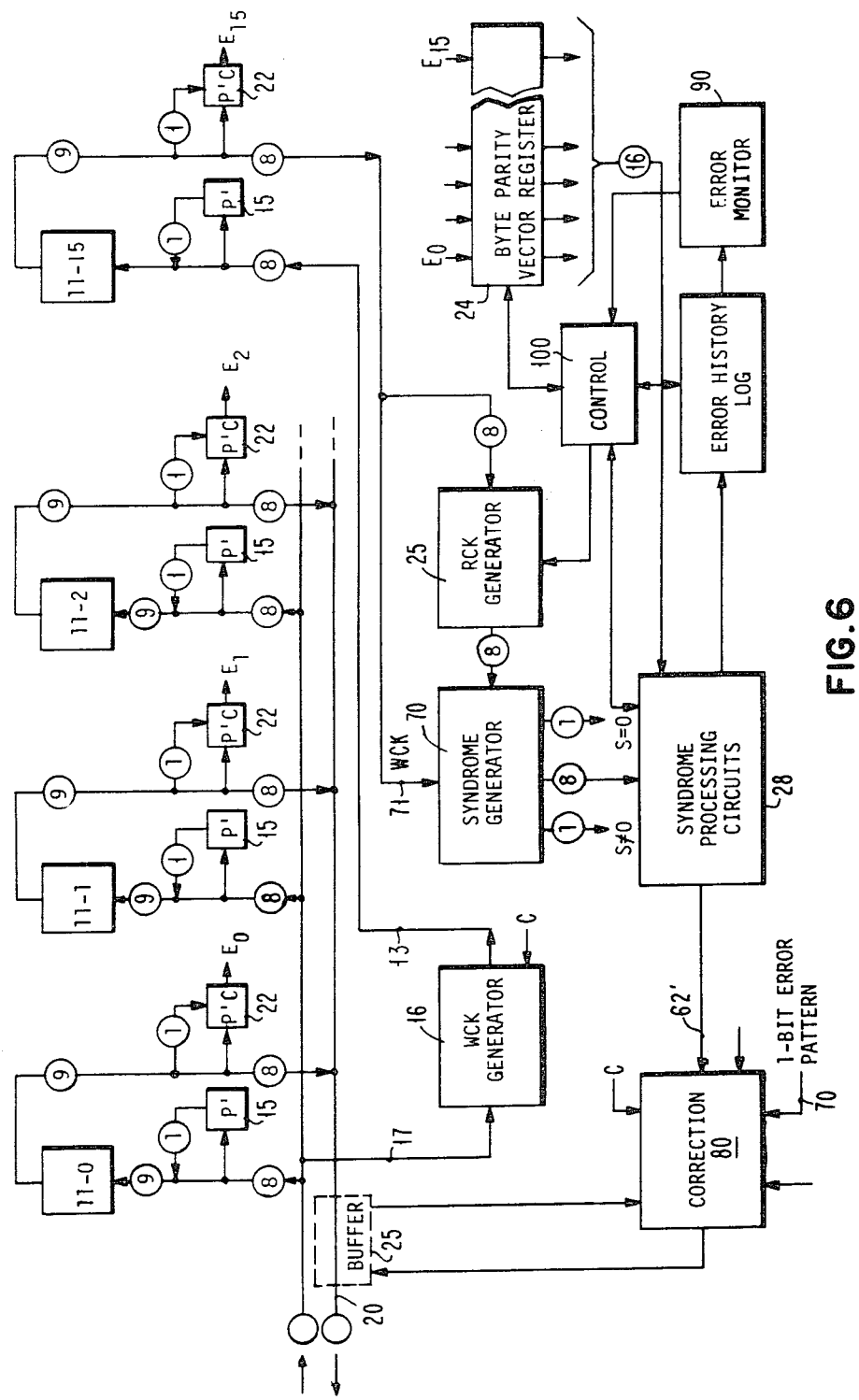
FIG. 6 is a functional block diagram of a memory system embodying the dual function ECC system of the present invention.

The invention will now be described in connection with a memory system which is adapted to store a plurality of words consisting of 16 bytes, as seen in FIG. 4b, each byte of which is stored in a different one of 16 failure independent memory units along with a parity bit for each byte. Such a memory system is shown in FIG. 6 in which the memory 10 consists of 16 failure independent units 11-0 through 11-15. Each unit 11 functions to store an 8-bit byte plus a parity bit at each addressable storage location of memory 10. The function of the parity bit will be described later on in the specification. Data is supplied to the memory on write data input bus 13 serial by byte and multiplexed into the memory 10 one 16-byte word at a time. It will be assumed that the data stored in memory 10 follows the general format shown in FIGS. 4a through 4c and 5a and 5b where a word consists of 16 bytes including one check byte CK, that a segment consists of, for example, 175 words, and that the 16 failure independent units 11 together store approximately 800 segments.

As shown, the serial by byte data is supplied to the ECC write check byte generator 16 on bus 17. The function of the ECC write check byte generator 16 is to generate a write check byte WCK based on a predetermined parity check matrix H' corresponding to the table shown in FIG. 3 which has been developed, for example, from the parity check table shown in FIG. 1 in accordance with a systematic approach which is readily implementable in hardware. The write check byte WCK is stored in unit 11-15 in parallel along with the first 15 data bytes received on write data input bus 13.

As shown, a parity bit generator 15 is associated with each input byte so that each unit 11 stores a 9-bit byte. The respective parity bits, however, do not enter into the development of the write check character WCK which is stored in unit 11-15.

The system shown in FIG. 6 also includes a read data bus 20 on which serial by byte data is supplied to a using data processing system. As shown, a 16-byte word is read out in parallel from the units 11-0 through 11-15, one byte per unit, and serialized by byte onto read data bus 20. During readout, each byte is again parity checked by parity check circuit 22, and a 16-bit "byte parity vector" is stored in a byte parity vector register 24. The serial by byte data word is also supplied to read ECC check character generator 25 which functions to generate a read check byte RCK from the first 15 data bytes. Syndrome generator 70 compares the newly generated read check byte RCK from generator 25 with the previously stored write check byte WCK supplied from unit 11-15 to produce a syndrome byte S consisting of bits S0 through S7.

Syndrome generating circuit 17 also supplies an S=0 signal and an S≠0 signal.

As is conventional in ECC systems, an all-zero syndrome is assumed to represent no error, and a non-zero syndrome to represent an error. The parity check table of FIG. 3 is designed to protect against known predetermined error characteristics of the system. Because of the nature of the storage modules, e.g., bubble chips, one error characteristic of the system is that random single-bit errors occur at some probability rate, e.g., once in $10^8$ bits, and, in addition, repetitive multi-byte errors in the same byte position of successive words occur with a much lesser probability, e.g., when a module or chip fails completely.

Based on the above knowledge, the syndrome processing circuit 28 functions to process non-zero syndromes on the premise that the non-zero syndrome is caused by a single-bit error which can be corrected. The probability of more than one single-bit random error occurring in a data word is close to zero, but, in reality, is not zero and, hence, a non-zero syndrome byte could be developed for multi random errors in one word which might cause a miscorrection. Further, the probability of a multi-bit error in one byte resulting in a non-zero syndrome byte corresponding to a single random 1-bit error is also greater than zero, but is much higher than two or more random 1-bit errors occurring in different bytes in the same word.

The system shown in FIG. 6, as it has been described so far, is generally similar in function and operation to prior art error correcting systems employed to correct one known type of error, e.g., single random 1-bit errors. That is, the generated syndrome byte has a single complete correction function and, in some cases, may provide additional information, such as the presence of an uncorrectable error or the correction of one type of error and the detection of another type of error.

The following more detailed description of the system shown in FIG. 6 will describe an ECC method and system for handling the problem created, for example, when, in addition to the occurrence of random single-bit errors, one of the failure independent units 11 may fail completely and create a multi-bit error.

Write Check Byte Generator

Figure 7A:
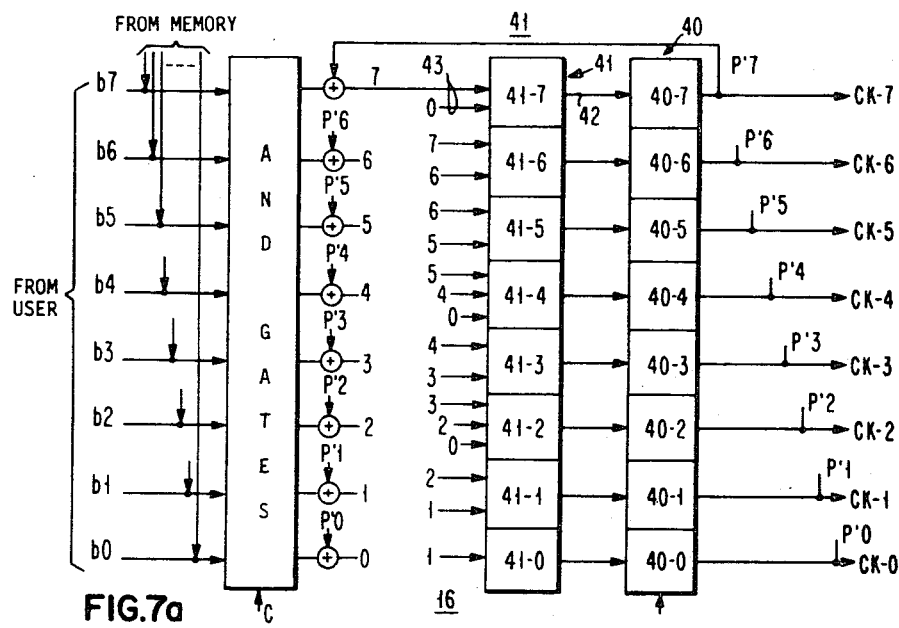
FIGS. 7a and 7b are more detailed drawings of the check character generators 16 and 25 and the syndrome processing block 28 shown in FIG. 6.

FIG. 7a represents the detailed circuitry of WCK generator 16 employed in the system of FIG. 6 for generating the write check byte WCK by processing data a byte at a time. The circuitry comprises an eight-stage register 40 and a logic block 41 for each stage having its output 42 connected to the input of each stage of the register and a series of inputs 43 for selecting bit positions on each byte. As shown, logic block 41-7 receives inputs from bit positions b7 and b0 of each data byte and from bit positions P'7 and P'0 from register 40. Logic block 41-6 includes inputs from bit positions b7, b6, P'7 and P'6; logic block 41-5 from bit positions b6, b5, P'6, and P'5; logic block 41-4 from bit positions b5, b4, b0, P'5, P'4, and P'0; logic block 41-3 from bit positions b4, b3, P'4, and P'3; logic block 41-2 from bit positions b3, b2, b0, P'3, P'2, and P'0; logic block 41-1 from bit positions b2, b1, P'2, and P'1; and logic block 41-0 from bit position b1 of each data byte and P'1 from register 40.

Each logic block is functionally a modulo-2 adder. Each logic block 41 functions to "exclusive-OR" all of its inputs. For example, logic block 41-7 which has four inputs, b7, b0, P'7, and P'0 (the output of stages 40-7 and 40-0 of register 40) would comprise three exclusive-OR gates connected in series such that b7 and b0 would be exclusive-OR'd and the result then exclusive-OR'd with bit P'7 and that result exclusive-OR'd with P'0. The result is stored in stage 7 of register 40 with the operation being completed in one cycle. Logic blocks 41-6 through 41-0 operate in a similar manner to generate P'6 through P'0. Since each of the bit positions of the data byte which are inputs to the various logic blocks and each of the inputs from the registers to the respective logic blocks correspond, it is preferable to first combine the bit from the data byte with the bit from the corresponding position of the register and then distribute the result to the appropriate logic blocks. At the end of 15 data bytes or 15 cycles, the write check character WCK has been developed and can be stored in unit 11-15 of memory 10 during the 16th cycle. Units 40 and 41 receive suitable control signals C from control block 100 of FIG. 6 to control the cycling operation. Gating logic 45 may also be provided for input data bytes.

Figure 1:
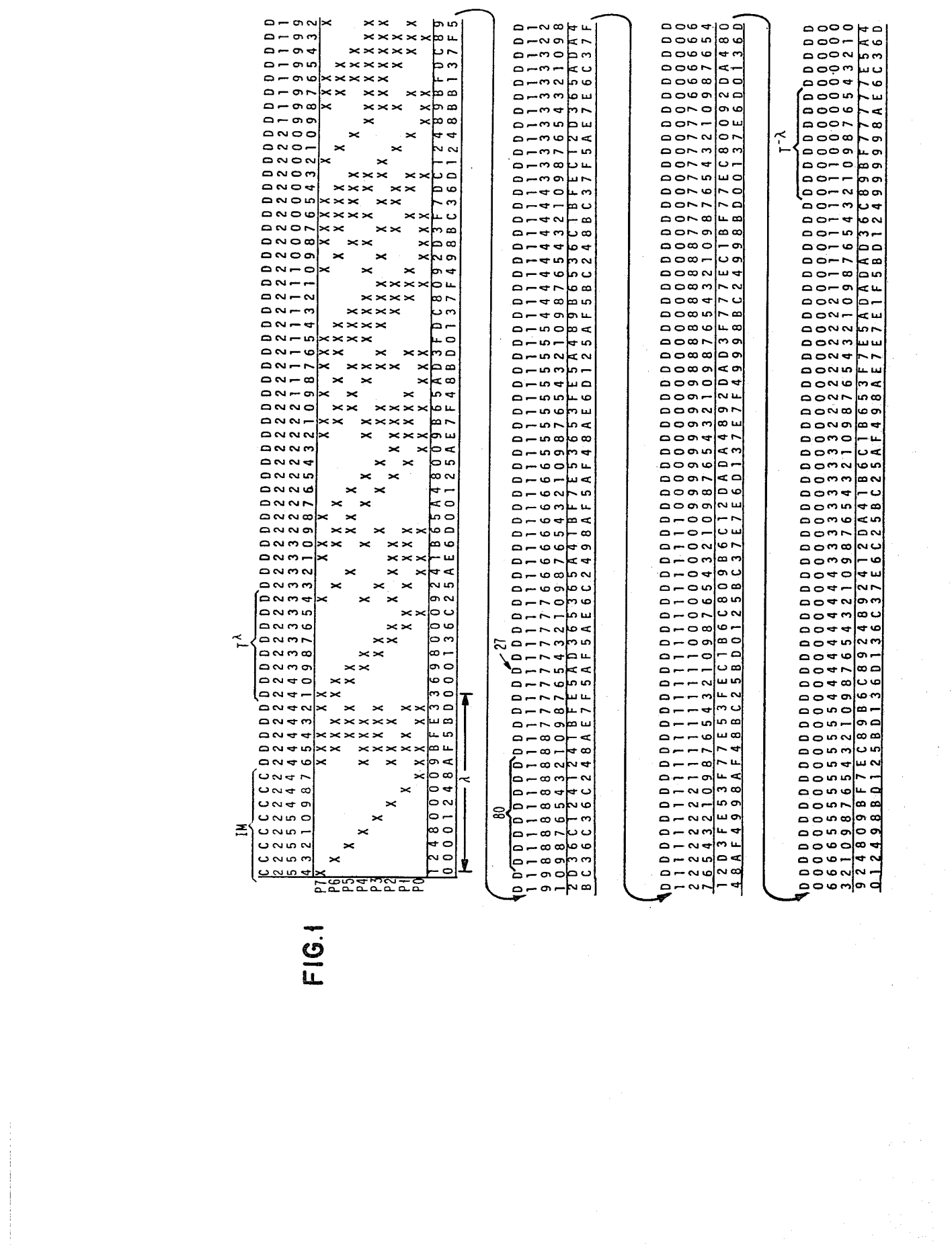

Inputs to the logic blocks 41-7 through 41-0 are determined from an 8×8 matrix in the m-sequence of FIG. 1, which is displaced λ columns from the identity matrix IM which begins at column C254 in FIG. 1. λ was chosen as 13 in the described embodiment so that the matrix shown in Table 1, designated $T^\lambda$ in FIG. 1, corresponds to positions D241 to D234 in FIG. 1.

TABLE 1

| P' | b7 | b6 | b5 | b4 | b3 | b2 | b1 | b0 |
|----|----|----|----|----|----|----|----|----|
| 7  | 1  | 0  | 0  | 0  | 0  | 0  | 0  | 1  |
| 6  | 1  | 1  | 0  | 0  | 0  | 0  | 0  | 0  |
| 5  | 0  | 1  | 1  | 0  | 0  | 0  | 0  | 0  |
| 4  | 0  | 0  | 1  | 1  | 0  | 0  | 0  | 1  |
| 3  | 0  | 0  | 0  | 1  | 1  | 0  | 0  | 0  |
| 2  | 0  | 0  | 0  | 0  | 1  | 1  | 0  | 1  |
| 1  | 0  | 0  | 0  | 0  | 0  | 1  | 1  | 0  |
| 0  | 0  | 0  | 0  | 0  | 0  | 0  | 1  | 0  |

$T^\lambda$

The first row of the matrix shows that new P'7 is the modulo-2 sum of the value of bit positions b7 and b0 of the data byte and the previous values in positions P'7 and P'0 of register 40. The second row shows that new P'6 is the modulo-2 sum of the value of bit positions b7 and b6 of the data byte and the previous values in positions P'7 and P'6 of register 40, etc.

The circuitry of FIG. 7a in developing the write check character, performs several logical operations on the data bytes simultaneously during each of its cycles. First, it should be understood that since 15 data bytes are entered serial by byte during the first 15 cycles, the 0th data byte can be considered to be cycled through the generator 15 times, the 1st byte 14 times, etc. The 15th byte (byte 14) is, therefore, only cycled once through the generator.

The write check character WCK for any data word is developed, in effect, from the modulo-2 sum of partial check characters PCK developed for each of the 15 bytes of data. The development of each partial check character PCK for a given byte position of data is achieved by processing the associated data byte through the logic blocks 41 and register 40 a number of times related to the position of the byte in the data word. For example, if data byte 0 is recycled through the check byte generator 16 of FIG. 7a 14 times after being entered, the resulting pattern corresponds to the partial parity check character PCK-0 for byte 0. If data byte 1 is recycled through the identical circuit 13 times after being entered, the partial parity check character PCK-1 for byte 1 is developed. Data byte 14 is merely entered into the circuits during cycle time 15 once to generate its partial parity check character PCK-14 and is not recycled since it will be seen that the matrix $T^\lambda$, from which the inputs of the logic blocks 41 are determined, corresponds to the matrix associated with byte 14 in FIG. 3. The check generator 16 shown in FIG. 7a operates on the principle that there is a known relationship between the true check character TCK that is generated when the data byte is checked by its associated matrix in FIG. 1 and the bit pattern that is generated when the data byte is checked by a matrix associated with a different byte position, e.g., byte 14. The relationship is such that the position of the true check character in the m-sequence relative to the position of the pattern corresponding to the data byte in the m-sequence will be displaced nλ columns from the position in the m-sequence of the bit pattern developed by the matrix associated with the other byte position.

This can be seen in Table 2 in which it is assumed that the 0th data byte supplied to the check generator was x55 or 1010 1010 and that the remaining 14 bytes of the data word were all 0's.

In Table 2, the column labelled "Bit Pattern" is the value stored in register 40 at the end of each cycle. This value is fed back to the logic blocks 41 during the next cycle to produce a new bit pattern. The second to the last column of Table 2 represents the position in the m-sequence of FIG. 1 of the 8-bit pattern developed during each cycle. The position of the data byte pattern x55 in the m-sequence of FIG. 1 is position D176, identified by reference numeral 27.

The last column of Table 2 expresses the displacement in FIG. 1 from the position D176 of the data byte in terms of a constant factor λ (13) and the byte position.

TABLE 2

| Byte | Cycle | b7 | b6 | b5 | b4 | b3 | b2 | b1 | b0 | P'7 | P'6 | P'5 | P'4 | P'3 | P'2 | P'1 | P'0 | M-Sequence Position | Displacement |
|------|-------|----|----|----|----|----|----|----|----|----|----|----|----|----|----|----|----|---------------------|--------------|
| 0  | 0  | 1 | 0 | 1 | 0 | 1 | 0 | 1 | 0 | 1 | 1 | 1 | 1 | 1 | 1 | 1 | 1 | 163 | = 176 − (1 × 13) |
| 1  | 1  | 0 | 0 | 0 | 0 | 0 | 0 | 0 | 0 | 0 | 0 | 0 | 1 | 0 | 1 | 0 | 1 | 150 | = 176 − (2 × 13) |
| 2  | 2  |   |   |   |   |   |   |   |   | 1 | 0 | 0 | 0 | 1 | 0 | 1 | 0 | 137 | = 176 − (3 × 13) |
| 3  | 3  |   |   |   |   |   |   |   |   | 1 | 1 | 0 | 0 | 1 | 1 | 1 | 1 | 124 | = 176 − (4 × 13) |
| 4  | 4  |   |   |   |   |   |   |   |   | 0 | 0 | 1 | 1 | 1 | 1 | 0 | 1 | 111 | = 176 − (5 × 13) |
| 5  | 5  |   |   |   |   |   |   |   |   | 1 | 0 | 1 | 1 | 0 | 1 | 1 | 0 | 98  | = 176 − (6 × 13) |
| 6  | 6  |   |   |   |   |   |   |   |   | 1 | 1 | 1 | 0 | 1 | 1 | 0 | 1 | 85  | = 176 − (7 × 13) |
| 7  | 7  |   |   |   |   |   |   |   |   | 0 | 0 | 0 | 0 | 1 | 1 | 1 | 0 | 72  | = 176 − (8 × 13) |
| 8  | 8  |   |   |   |   |   |   |   |   | 0 | 0 | 0 | 0 | 1 | 0 | 0 | 1 | 59  | = 176 − (9 × 13) |
| 9  | 9  |   |   |   |   |   |   |   |   | 1 | 0 | 0 | 1 | 1 | 0 | 0 | 0 | 46  | = 176 − (10 × 13) |
| 10 | 10 |   |   |   |   |   |   |   |   | 1 | 1 | 0 | 1 | 0 | 1 | 0 | 0 | 33  | = 176 − (11 × 13) |
| 11 | 11 |   |   |   |   |   |   |   |   | 1 | 0 | 1 | 1 | 1 | 1 | 1 | 0 | 20  | = 176 − (12 × 13) |
| 12 | 12 |   |   |   |   |   |   |   |   | 1 | 1 | 1 | 0 | 0 | 0 | 0 | 1 | 07  | = 176 − (13 × 13) |
| 13 | 13 |   |   |   |   |   |   |   |   | 0 | 0 | 0 | 0 | 0 | 1 | 0 | 0 | 249 | = 176 − (14 × 13) Mod 255 |
| 14 | 14 | 0 | 0 | 0 | 0 | 0 | 0 | 0 | 0 | 0 | 0 | 0 | 0 | 0 | 1 | 1 | 0 | 236 | = 176 − (15 × 13) Mod 255 |

It can be seen from the first row of the $T^\lambda$ matrix shown in Table 1 that P'7 is the modulo-2 sum of the value of the data in positions b7 and b0 since the register is initially set to all zeros and inputs P'7 and P'0 have no effect. Similarly, partial parity bit P'6 is the modulo-2 sum of the value of the data in bit positions b7 and b6 which is also equal to 1. A similar operation will show that P'5 is a 1, P'4 is a 1, P'3 is a 1, P'2 is a 1, P'1 is a 1, and P'0 is a 1. The resulting pattern xFF (1111 1111) is shown on line 1 of Table 2.

Under the above assumption, where only the 0th data byte contains data and is cycled 14 more times, the partial check character PCK-0 for byte 0 is equal to the write check character WCK for the word. It can be seen that the partial check character 0000 0110 (x06) that was developed for byte 0 corresponds to the true check character TCK that would be generated if the same data word had been processed serial by bit or if the data byte x55 had been applied only to the eight-column matrix associated with byte 0 in FIG. 3.

The relationship in the m-sequence between the position of the pattern corresponding to a data byte of 1010 1010 (x55) and the position of the pattern correponding to the partial check character PCK-0 is as follows:

$$X - 13(Z) \text{ Mod } 255$$

where

X = position of the pattern corresponding to the data byte;

Z = 15 minus the byte number in the data word.

It can be shown by a table similar to Table 2 that the above relationship exists for any pattern of data in any byte position of the word. It is, therefore, possible to process the data word on a byte basis to generate the write check character WCK.

Read Check Byte Generator

The details of the read check byte generator are identical to the write check byte generator except that data bytes 0–14 are supplied from memory units 11-0 through 11-14 on bus 20, and for the 16th cycle. During the 16th cycle, the computed read check byte is exclusive-OR'd with the write check byte by the syndrome generator logic 70 shown in FIG. 6 as it is read out from memory unit 11-15 to produce the syndrome byte S. Syndrome generator 70 receives two 8-bit inputs WCK and RCK. The write check character WCK is supplied on input 71 and the newly developed read check character RCK is supplied on input 72. The outputs include an S=0 line 73 and an S≠0 signal line 74, plus an 8-bit bus 75 for transferring a syndrome byte S to the syndrome processing circuit 28. These signals are also used by other units of the system of FIG. 6. If desired, the WCK unit 16 and RCK unit 25 may be combined in one unit with appropriate controls.

Syndrome Processing Circuit

The syndrome processing circuit 28 in FIG. 6 which functions to process the non-zero syndrome byte for correcting random single-bit errors, also functions to process the same non-zero syndrome byte to determine the particular error pattern when the location in the data word of the byte position containing the multi-bit error is provided.

The circuit for processing the syndrome for a random single-bit error on a byte basis is similar in some respects to the circuit employed for generating the check bytes on a byte-wide basis.

Figure 7B:
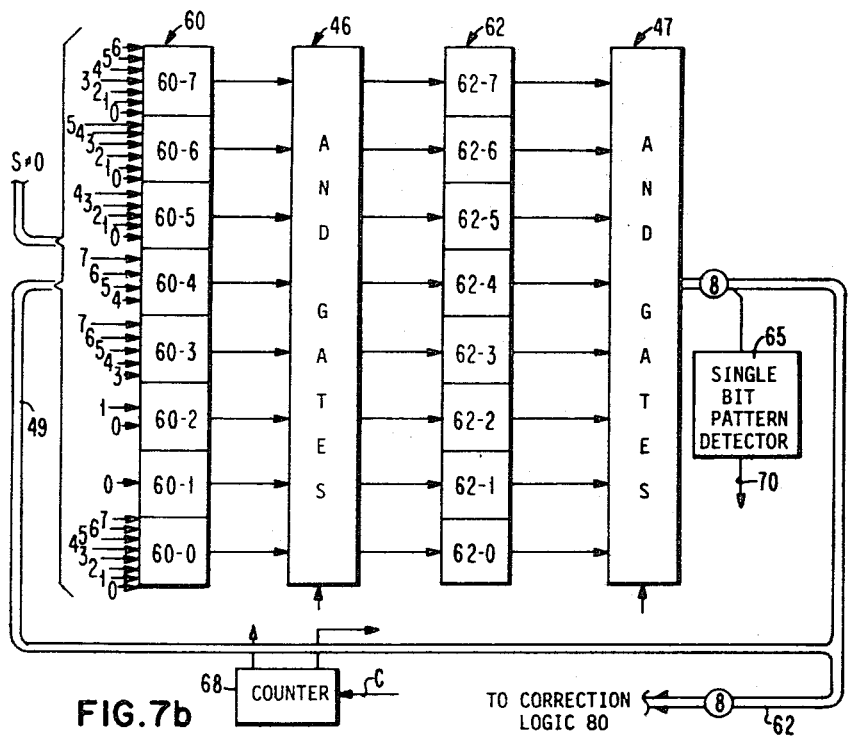

FIG. 7b shows the detailed circuit which comprises an 8-stage register 62 and a logic block 60 associated with the inputs of each stage of the register 62. A non-zero syndrome byte S is applied to the input of register 62 through AND-gate 46. The output of register 62 is fed back through gate 47 as inputs 49 to each associated logic block 60-7 through 60-0. The inputs 49 for each block 60 are selected from another matrix $T^{-\lambda}$ shown below in Table 3 and in FIG. 1 in a manner discussed earlier in connection with logic blocks 41 of the check byte generator. Logic blocks 60 function to sum modulo-2 the value of respective inputs.

TABLE 3

|  | D07 | D06 | D05 | D04 | D03 | D02 | D01 | D00 |
|---|---|---|---|---|---|---|---|---|
| Bit Position | 12 7 | 11 6 | 10 5 | 09 4 | 08 3 | 07 2 | 06 1 | 05 0 |
| 60-7 | 0 | 1 | 1 | 1 | 1 | 1 | 1 | 1 |
| 60-6 | 0 | 0 | 1 | 1 | 1 | 1 | 1 | 1 |
| 60-5 | 0 | 0 | 0 | 1 | 1 | 1 | 1 | 1 |
| 60-4 | 1 | 1 | 1 | 1 | 0 | 0 | 0 | 0 |
| 60-3 | 1 | 1 | 1 | 1 | 1 | 0 | 0 | 0 |
| 60-2 | 0 | 0 | 0 | 0 | 0 | 0 | 1 | 1 |
| 60-1 | 0 | 0 | 0 | 0 | 0 | 0 | 0 | 1 |
| 60-0 | 1 | 1 | 1 | 1 | 1 | 1 | 1 | 1 |
| Hexadecimal | 89 | 99 | B9 $T^{-\lambda}$ | F9 | 79 | 78 | 7A | 7E |

The manner in which a multi-bit error pattern is determined from the syndrome byte S, assuming that the location of the byte containing the multi-bit error has been identified by suitable means, will first be described. Next, the manner in which the byte location in error is developed in the system shown in FIG. 6 will be described. Lastly, the correction of a single-bit error on a byte basis using the processing hardware of FIG. 7b will be described.

In order for the single syndrome byte S to perform the dual function of correcting single random 1-bit errors or, alternatively, determining the pattern of a multi-bit error in a known erroneous byte, the respective check characters WCK and RCk from which the syndrome bytes are generated must be developed in accordance with a parity check table similar to that shown in FIG. 3. The parity check table is shown in FIG. 3 in hexadecimal notation where, as shown in FIG. 1a, each character 0-F represents a unique pattern of four bits. FIG. 3 is developed from the m-sequence table shown in FIG. 1 by selecting (M) 16 (equally spaced) groups of (b) eight columns, resulting in an 8×128 parity check table. In essence, 128 columns of the table of FIG. 1 have been selected to form the table of FIG. 3. In theory, the number of columns eliminated between each selected group (of eight contiguous columns) could vary between 0 up to a number which would permit 16 groups to be selected, provided they can be identified subsequently during the syndrome processing steps. As shown, the number of columns eliminated in FIG. 1 between each selected group is five, which simplifies the hardware implementation for developing the matrix H' represented by the table of FIG. 3 from matrix H represented by the table of FIG. 1. It can be shown that the matrix H' has the same single random 1-bit error correcting capabilities as matrix H for a data word consisting of 16 8-bit bytes or 128 bit positions.

The conventional serial by bit non-zero syndrome processing steps could be employed, if desired, to correct a single random 1-bit error in each data word. Since only 128 8-bit permutations of the possible 256 8-bit permutations can be generated for a single 1-bit random error in a data word, a syndrome byte which does not match with any of the 128 valid error syndromes shown in FIG. 3 is readily detectable and identifiable as a non-correctable error. At this point, it is assumed that the syndrome S has been processed for a single-bit error and it has been determined that the error is not a single-bit error but that a multi-bit error in one byte has occurred. Based on the knowledge of the error probabilities, this is the most likely probability after not finding a single-bit error. The same syndrome byte S is then employed to determine which one of the possible multi-bit error patterns exists in an identified byte location of the data word. In the embodiment shown, 247 different multi-bit error patterns are possible since $2^8$ or 256 permutations are possible with eight bits. Eight of these permutations are single-bit errors, and the all-zero permutation is not an error, leaving 247 possible multi-bit error patterns in the defective byte location.

One manner in which a defective byte location containing a multi-bit error can be identified will now be described.

Various arrangements may be employed to provide an identification of the byte position in the data word that has a multi-bit error. As discussed previously, the system shown in FIG. 6 generates a parity bit for each byte of the data supplied to the system and stores these parity bits in memory 10 along with the actual data word. During readout of the memory, parity for each byte is checked and a 16-bit "byte parity vector" is stored in byte parity vector register 24. When the single-bit error syndrome process indicates an uncorrectable error, it is assumed that the uncorrectable error is a multi-bit error in one of the byte positions. The error-byte position is identified by the byte parity vector 50% of the time since the parity vector will indicate a byte in error only when an odd number of bit positions of that byte are in error. It will not indicate the byte in error if an even number of bit positions in the byte are in error.

If the ninth bit position of the storage module 10 is sometimes used for functions other than parity bits, as discussed earlier in connection with the system configured with chips having a few defective loops, the parity byte vector cannot always be relied on to indicate the location of the byte in error. The single-bit error processing which will be described in detail later on may use the parity byte vector to confirm the location of the error which was determined by processing the syndrome byte S for single-bit errors.

The system as shown in FIG. 6, therefore, uses the information contained in the byte parity vector, when present, to assist in switching to the multi-bit error syndrome process. The specific manner in which byte parity vector is generated will now be described.

Byte Parity Vector

For purposes of this description, it will be assumed that a multi-bit error having a pattern 0000 1101 has occurred in the tenth byte b10 of the data word, that is, bit positions 4, 5, and 7 are in error. The parity vector stored in the 16-stage byte parity vector register would then be as follows: 0000 0000 0010 0000, reading from left to right, indicating an error has occurred in the tenth byte.

By assuming a data word containing all zeros, it will be seen that the write check character which is generated and stored will be all zeros. If it is further assumed that each bit position in FIG. 3, D84, D85 and D87, contains an error, it will be seen that the read check character will produce an 8-bit byte which is not all zeros since, as shown in Table 4, the parity check bits P0 through P7 will develop by simple modulo-2 addition of the respective bit positions, the read check character 0111 0011 (xEC) where P7 is the first bit position.

TABLE 4

| ERROR BIT POSITION | ED87 | ED86 | ED85 | ED84 | RCK | WCK | S | HEXADECIMAL |
|---|---|---|---|---|---|---|---|---|
| P7 | 1 | 0 | 0 | 1 | 0 | 0 | 0 | |
| P6 | 1 | 0 | 0 | 0 | 1 | 0 | 1 | |
| P5 | 0 | 0 | 1 | 0 | 1 | 0 | 1 | xE |
| P4 | 0 | 0 | 1 | 0 | 1 | 0 | 1 | |
| P3 | 1 | 0 | 0 | 1 | 0 | 0 | 0 | |
| P2 | 1 | 0 | 0 | 1 | 0 | 0 | 0 | |
| P1 | 0 | 0 | 1 | 0 | 1 | 0 | 1 | xC |
| P0 | 0 | 0 | 1 | 0 | 1 | 0 | 1 | |

Since X=xEC is not a valid error syndrome for a single random 1-bit error because it is located at position D003 in FIG. 1, it would have been designated as an uncorrectable error by the single-bit pattern detector 65 shown in FIG. 7b and discussed later on in the specification. In addition, if the byte parity vector register contained only one 1, this information could also be employed to validate on a probability basis that the error is a multi-bit error in one byte.

Processing of the non-zero syndrome byte for a multi-bit error may, therefore, be started in response to the indication of an error other than a single-bit error.

Multi-Bit Error Processing

In processing multi-bit errors, the first function is to select the group of columns associated with the bit positions in the parity check matrix H which make up the defective byte position. The section 80 of matrix H in FIG. 1 reproduced below as Table 5 corresponds to the tenth byte in FIG. 3 where an X in the table is changed to a 1 and a 0 corresponds to a blank.

TABLE 5

| H H' | D187 87 | 86 | 85 | 84 | 83 | 82 | 81 | D182 80 |
|---|---|---|---|---|---|---|---|---|
| (x3) | 1 1 0 0 | (x6) 0 1 1 0 | (x6) 0 0 1 1 | (x1) 1 0 0 0 | (x2) 0 1 0 0 | (x4) 0 0 1 0 | (x1) 1 0 0 0 | (x2) 0 1 0 0 |
| (x3) | 1 1 0 0 | (x6) 0 1 1 0 | (x6) 0 0 1 1 | (x3) 1 1 0 0 | (x6) 0 1 0 0 | (x6) 0 1 1 0 | (x2) 0 0 1 0 | (x4) 0 0 1 0 |

It will also be recalled that the matrix of Table 5 is generated by an m-sequence generator. The parity check table of FIG. 1 can be viewed as an 8-bit m-sequence which repeats itself after 255 positions. The 8-column segment designated 80 in FIG. 1 is represented by the matrix of Table 5 and is found in positions D189 through D182 of FIG. 1 if the start of the sequence is chosen as the D000 bit position. If now the entire m-sequence is, in effect, rotated to position the right-hand column D182 of the matrix 80 of Table 5 as the starting point of the m-sequence, i.e., at the D000 bit position, each of the original positions of the columns D189-D182 can be considered to have had a rotational factor R applied to them. The rotational factor R will be constant for each of the columns for the tenth byte of the data word. Each byte position of the data word will have a factor R which will be unique and related to the position of the byte in the data word. This rotational factor R associated with each byte of the data word also corresponds to the number of shifts required by the m-sequence generator to advance the m-sequence to the appropriate starting bit position of the corresponding byte.

The above described rotational factor R can be described mathematically in terms of the relative displacement in the m-sequence of syndrome patterns for the same error types occurring in the corresponding bit positions of each byte of the data word.

Table 6 represents the set of syndrome bytes that would be generated for a multi-bit error, i.e., a double error in bit positions 7 and 6 of each byte of the word. The syndrome byte for this type of error is developed merely by the modulo-2 addition of the single-bit error syndrome bytes for the respective bit positions in error. For example, for byte 15, bits 7 and 6 in error, the syndrome 1100 0000 in the FIG. 1 or FIG. 3 tables is the modulo-2 sum of 1000 0000 and 0100 0000 which is located at position D241 in the m-sequence of FIG. 1.

TABLE 6

| Byte Position | 2-Bit Error Syndrome Bits 7 & 6 S7 - S6 | Position in M-Sequence | Relative Displacement |
|---|---|---|---|
| 0 | 1001 1000 | D46 | = 46 + (0 × 13) |
| 1 | 0000 1001 | D59 | = 46 + (1 × 13) |
| 2 | 0000 1110 | D75 | = 46 + (2 × 13) |
| 3 | 1110 1101 | D85 | = 46 + (3 × 13) |
| 4 | 1011 0101 | D95 | = 46 + (4 × 13) |
| 5 | 0001 1101 | D111 | = 46 + (5 × 13) |
| 6 | 1100 1111 | D124 | = 46 + (6 × 13) |
| 7 | 1000 1010 | D137 | = 46 + (7 × 13) |
| 8 | 0001 0101 | D150 | = 46 + (8 × 13) |
| 9 | 1111 1111 | D163 | = 46 + (9 × 13) |
| 10 | 1010 1010 | D176 | = 46 + (10 × 13) |
| 11 | 1100 1100 | D189 | = 46 + (11 × 13) |
| 12 | 1000 1000 | D202 | = 46 + (12 × 13) |
| 13 | 1111 0000 | D215 | = 46 + (13 × 13) |
| 14 | 1010 0000 | D228 | = 46 + (14 × 13) |
| 15 | 1100 0000 | D241 | = 46 + (15 × 13) |

Since the relationships exist around identical type error patterns in the different bytes, the correct error pattern of a multi-bit error in one byte can be automatically generated from a non-zero syndrome byte since R is a known constant for any system and the byte location K is provided, for example, by the byte parity vector generator discussed earlier. Since R is equal to (15-K)λ shifts where λ is 13, the circuit of FIG. 7b, by cycling (15-K) times, produces the correct error pattern.

The basic function of the multi-bit syndrome error processing circuit is, therefore, merely to rotate the m-sequence (15-K)λ shifts relative to the multi-bit error syndrome S to find the correct error pattern.

This error pattern is then employed to correct the error since the byte location is known from the byte parity vector register 24. In contrast, processing for single-bit error syndromes, which will now be discussed, involves shifting the m-sequence λ columns during each cycle, beginning at a known starting point, and inspecting for a single-bit error pattern in register 62, at which point the count is indicative of the byte position in error.

It has been found that single random 1-bit errors can be corrected on a byte basis in a manner similar to correcting multi-bit errors in one byte. The multi-bit error processing circuit of FIG. 7b is employed to also correct a single random 1-bit error.

Table 7 summarizes the relationships of relative displacements R in the M-sequence for single-bit type errors in the first bit position of each byte of a data word.

TABLE 7

| Byte Position | Single-Bit Error Syndrome S7 - S0 | Position in M-Sequence | Relative Displacement |
|---|---|---|---|
| 0 | 0001 1101 | D052 | = 52 + (0 × 13) |
| 1 | 0001 0110 | D065 | = 52 + (1 × 13) |
| 2 | 1111 1101 | D078 | = 52 + (2 × 13) |
| 3 | 0100 1111 | D091 | = 52 + (3 × 13) |
| 4 | 1001 0011 | D104 | = 52 + (4 × 13) |
| 5 | 1110 0010 | D117 | = 52 + (5 × 13) |
| 6 | 1011 1100 | D130 | = 52 + (6 × 13) |
| 7 | 0011 0001 | D143 | = 52 + (7 × 13) |
| 8 | 1100 0111 | D156 | = 52 + (8 × 13) |
| 9 | 0110 0011 | D169 | = 52 + (9 × 13) |
| 10 | 0100 0010 | D182 | = 52 + (10 × 13) |
| 11 | 0111 1100 | D195 | = 52 + (11 × 13) |
| 12 | 1011 0001 | D208 | = 52 + (12 × 13) |
| 13 | 1101 1110 | D221 | = 52 + (13 × 13) |
| 14 | 1001 0100 | D234 | = 52 + (14 × 13) |
| 15 | 0000 0001 | D247 | = 52 + (15 × 13) |

The table shows in Column 3 that the relative displacement in the m-sequence between each pair of the 15 syndromes corresponding to a single-bit error in the first bit position in each byte is constant, e.g., 13, and is equal to λ where λ is the sum of the number of bit positions in the byte and the number of columns between groups, i.e., the number of columns that have been skipped in converting matrix H to matrix H', which in this case was five. It will be seen that if a single-bit error in the first bit position of byte 10 occurs, by shifting the m-sequence five λ shifts, the correct single-bit error pattern is developed. The same relationships exist for single-bit errors in each bit position of each byte, that is, the correct error pattern for the single-bit error will be developed by shifting the m-sequence (15-K)λ shifts starting with the developed syndrome byte in register 62, where K is the number of the byte position in the data word where the error occurred.

However, if the byte location is unknown or not used and a single-bit is assumed in error, a random single-bit error in any byte can be corrected on a byte basis by counting the number of λ shifts or cycles starting from the 182 position in the m-sequence table until a single-bit error pattern is detected. This can be done by conventional logic looking for a single binary 1. The number of λ shifts subtracted from 15 then identifies the byte position containing the single-bit error pattern. The single-bit error can then be corrected by conventional logic on a byte basis since the defective byte location and error pattern are known.

With reference to FIGS. 6 and 7b, the non-zero syndrome byte is entered into the register 62 during the 0th cycle and, if the pattern corresponds to a single 1-bit error, the 1-bit pattern logic block 65 indicates this fact on line 70. If the resulting pattern contains more than one 1, a cycle is taken during which the syndrome pattern is fed back through logic block 60 as previously discussed, and so on, until a 1-bit pattern is detected or 16 cycles have occurred. The cycles are counted by counter 68. If a single-bit pattern is not detected after 16 cycles, the syndrome initially entered into the circuitry does not represent a random single 1-bit error. If, however, after J cycles, a single-bit pattern is found by the single-bit pattern logic 65, the single-bit error is located at the 15-J byte position of the data word. The error correction logic block 80 in FIG. 6 receives the data word serial by byte from buffer 25 or the using system and, when byte 15-J arrives, it is corrected using the single-bit error pattern in register 62 detected by block 65.

The system shown in FIG. 6 also includes means for determining the correct error pattern in those situations where the byte parity vector register does not indicate a multi-bit error because an even number of bits were in error in that byte. This will occur, as mentioned previously, on a statistical basis for 50% of the multi-bit errors that occur and when the ninth bit position is sometimes preempted to store a bit of data when a defective minor loop is encountered.

The system, therefore, logs error information for each data word read out because of a possibility of a mis-correction occurring either in the processing of the syndrome byte for random single-bit errors or multi-bit errors. The log shown in FIG. 8, therefore, indicates the segment number, the word number, the snydrome S, the byte position of the error, and the developed error pattern, whenever an error was corrected. The error log is cleared at the end of sussessful reading of every segment. If it is assumed that multi-bit errors result primarily from permanent type failures, the probability of the error repeating in the same byte position of the following data words which are processed is relatively high, but not absolutely certain since the error will be dependent on the pattern of the data stored and the nature of the failure. However, the probability is that, for example, when 20 consecutive data words are read out, a minimum of five errors will occur 99.9% of the time if a unit has failed.

The system shown in FIG. 6, therefore, includes error monitor 90 which monitors an error history log such as the table of FIG. 8, after a multi-bit error is suspected, to "confirm" and determine the byte position which has failed. When the same byte position is indicated to be in error, for example, four times in 20 words, the transfer of data to the using system is halted. The relationship between the memory system and the using data processing system may be such that a record of many words is not actually used by the system if it is suspected that one or more bytes may have been miscorrected. Thus, the record buffer 25 could be disposed between the memory 10 and the using system. Alternatively, the suspected data could be returned to the memory.

Since the suspected failing byte position is now confirmed and can be identified, the data is reread either from the memory or the buffer 90 beginning at the data word containing the first suspected multi-bit error. Using the error log, the miscorrections are removed and the multi-bit error syndrome processing circuit develops the correct error pattern for correcting each defective byte of each word.

Where the memory 10 is such that data is destroyed when it is read out as, for example, in some bubble memory systems, the data suspected of being in error may be reentered into the memory or buffered in an external memory so that it can be subsequently corrected before being provided to the using data processing system.

The specific details of the correction process or hardware 104 are not shown since various arrangements known in the art may be employed.

It will be further appreciated by those skilled in the art that, with a known component failure and the continuing probability of a random single-bit error occurring in $10^8$ bits that are read out from the memory 10, in most all cases, all of the data stored in the failed unit should be read out and corrected and stored in a suitable auxiliary memory without encountering a single-bit random type error. The failed unit can then be replaced manually or, if the system is so designed with spare memory units, the system could be reconfigured automatically and the information stored in the auxiliary memory then returned to the memory 10.

The function of coordinating the timing and control of the various functional blocks shown in the system of FIG. 6 is achieved by the control block 100 which provides timing and control signals at appropriate times to cause the various units to be sequenced in the appropriate manner, as described earlier in the specification. The details of the control block 100 are not shown since various technologies known in the art may be employed, such as a microprocessor or a sequencer, which receives signals from the various units and, in response to these signals, takes the appropriate action.

In the preferred embodiment of the invention described, the non-zero syndrome processing circuit is operated basically in two separate modes in a sequential fashion. In the first mode, single-bit processing, the control block causes the processing circuit to be cycled until a single-bit pattern is detected or until 16 cycles have occurred. When a single-bit pattern is detected prior to 16 cycles, the byte position containing the single-bit error is related to the number of cycles, and that number can then be confirmed by checking the byte parity vector register 24 to see if it also reflects the same byte in error. When a comparison does exist, the single-bit error is unmistakably confirmed. When no comparison exists and the remaining bit positions of the byte parity vector are also all zeros, a confirmation does exist that only one single-bit error has occurred. This is because a single-bit error will always produce a byte parity bit in register 24 for the defective byte positions.

Thus, if desired, the control of the processing circuit could be arranged so that a single-bit error and a multi-bit error in one byte are handled as one type of error and processed as a multi-bit error by using the contents of the byte parity vector register 24 to determine what correction mode to pursue. If the byte parity vector register 24 is first checked for its contents and only one 1 exists, the processing circuit may be stepped the number of times determined by the contents of the byte parity vector register 24, and the correct error pattern will be produced. This latter approach implies that every byte of data is always parity checked and prevents the use of the parity bit position for the storage of data bits at a defective loop location. However, if in checking the byte parity vector register 24 the contents are all zeros, then it is only necessary to process the non-zero syndrome byte as a random single-bit error by cycling the processing circuit while checking for a single-bit pattern, as described previously.

In a situation where the byte parity vector register 24 contains more than one 1, indicating the rare probability that a single-bit error has occurred in more than one byte, the single-bit syndrome processing algorithm could be followed to correct one of the suspected errors.

In the preferred embodiment described above, the parity check matrix H' of FIG. 3 was developed from the parity check matrix H of FIG. 1 by selecting $\lambda$ as 13 where $\lambda$ was greater than or equal to b and $M\lambda$ was less than $2^b$. The constraint that $M\lambda$ be less than $2^b$ is merely representative and was used to simplify the explanation of how M groups of submatrices were selected from matrix H to arrive at matrix H'. It will be recognized by those skilled in the art that since the m-sequence repeats itself after 255 positions and can be viewed as an infintely long table, $M\lambda$ could be greater than $2^b$ and still develop a matrix H' consisting of M b×b submatrices where all columns of the matrix H' are unique. For example, $\lambda$ could be chosen as 27, such that 16 submatrices spaced 19 columns apart will be selected. The first nine submatrices would be selected from the first 255 columns, and the remaining seven submatrices would be selected from the following 255 columns. The constraint that $M\lambda$ be less than $2^b$ merely insures that each column in matrix H' will be unique, or that M groups of submatrices do not overlap when $M\lambda$ is greater than $2^b$ since equivalent results will be achieved.

It should also be apparent to those skilled in the art that the preferred embodiment of the parity check matrices H and H' result in a single error correcting code. The teaching of the present invention is, however, just as applicable to more powerful codes such as single error correcting-double error detecting codes or double error correction codes. In such a situation, the submatrices which make up the parity check matrix H' are selected from a matrix H*, which, in turn, is defined by an appropriate polynomial which generates a plurality of independent sequence tables having shorter lengths. Mathematically, the polynomial from which the H* matrix is derived contains two or more factors. These factors will produce a plurality of sequence tables, and a given syndrome byte will appear in only one of the sequence tables.

The syndrome processing operation involving $\lambda$ shifts will remain the same because a given syndrome byte will select the correct independent sequence table automatically.

While the invention has been particularly shown and described with reference to a preferred embodiment thereof, it will be understood by those skilled in the art that various changes in the form and details may be made therein without departing from the spirit and scope of the invention.

Having thus described my invention, what I claim as new and desire to secure by Letters Patent is:

1. In combination, a memory system having M failure independent storage units, each of which is adapted to store one byte of a data word having M-1 data byte positions and one ECC check byte position, each said byte position having b bits, said memory having a random single-bit failure rate which is at least two orders of magnitude higher than the failure rate for multi-bit errors in the same byte position of successive words caused by one of said units failing, and a dual function ECC system for alternately correcting said single random 1-bit errors or said multi-bit errors from a failed unit by processing the same single syndrome byte in one word to correct both types of errors when the location in the data word of the defective byte is known and in another mode to correct single random 1-bit errors when the location of the defective byte is not known.

2. The combination recited in claim 1 further including a separate parity bit generator and a separate parity check circuit connected to each of said failure independent storage units of said memory system and a byte parity vector register having M stages, each stage having an input connected to the output of a different one of said parity check circuits, and means connecting the output of said register to said ECC system to provide an indication thereto of the byte location in the data word which contains one of said errors to enable said single syndrome byte to be processed is only one of said modes.

3. The combination recited in claim 2 in which said connecting means includes means for selecting one mode when a non-zero syndrome byte indicates an error and said register contents is all zeros and the other mode when said register contents contains only one 1.

4. The combination recited in claim 2 further including means in said ECC system for generating a write check character, a read check character and for generating said syndrome by exclusive-ORing said read check character while said data word is entered into said memory and read out of said memory, respectively.

5. The combination recited in claim 4 in which said ECC system includes means for generating said check characters so that each bit of each check character represents the modulo-2 sum of the value of data in bit positions of said data word which are determined by a parity check matrix H' developed from a parity check matrix H corresponding to an m-sequence having $2^M-1$ columns and b rows.

6. The combination recited in claim 5 in which said check character generating means includes a b stage register and a logic block associated with each said b stage, each said logic block having inputs from the output of selected register stages and from selected bit positions in each byte of the data word, which inputs have been determined in accordance with a b×b matrix $T^\lambda$ which is disposed $\lambda$-b columns from the identity matrix of said m-sequence where $\lambda$ is equal to or greater than b and $2^b$ is greater than $M\lambda$.

7. The combination recited in claim 6 in which said ECC system further includes a non-zero syndrome processing circuit adapted to receive a non-zero syndrome byte from said means for generating said syndrome byte, said processing circuit operating on a cyclic basis to change the pattern of said syndrome byte during each cycle in accordance with a predetermined function, and means for controlling the number of cycles of said processing circuit needed to develop a correct error pattern including means responsive to the contents of said byte parity vector register to cause said processing circuit to cycle the number of times related to the byte position in error in said data word.

8. The combination recited in claim 6 in which said ECC system further includes a processing circuit for non-zero syndrome bytes, including:

(a) a b stage register for receiving said syndrome byte;
(b) a logic block associated with each stage having an output connected to the input of each stage and an input connected to outputs of predetermined stages;
(c) means to cycle the contents of said register through said associated logic blocks back to said register whereby the pattern of said syndrome byte is changed after each cycle in a predetermined manner to a different pattern; and means connected to said processing circuit to selectively control the number of cycles taken by said processing circuit depending on whether said syndrome byte is being processed for a random single-bit error or a multi-bit error in said defective byte location.

9. The combination recited in claim 8 in which said predetermined manner is determined by a matrix $T^{-\lambda}$ disposed in said m-sequence $\lambda$-b columns from said identity matrix and in a direction opposite from the position of said matrix $T^\lambda$.

10. The combination recited in claim 9 further including means connected to said syndrome processing circuit for correcting an error in said data word in accordance with the pattern of said changed syndrome byte after said number of cycles has been taken.

11. The combination recited in claim 10 further including means connected to said processing circuit for logging information about each of said errors that is corrected by said system when processing a relatively large plurality of data words.

12. The combination recited in claim 11 in which said logged information includes for each error the identification of said data word, the developed error pattern, the contents of said parity vector generator, and the developed syndrome.

13. The combination recited in claim 12 further including means for monitoring said logged information to determine if a memory unit has failed, including means for indicating from the logged parity byte vector data that any byte position has experienced more than a predetermined number of errors.

14. The combination recited in claim 13 in which said correcting means includes means responsive to the error pattern data stored in said log to remove a previous miscorrection.

15. A dual function error correcting system for alternately correcting a single random 1-bit error in a data word having M-1 data byte positions and one check byte position, each of which consists of b bits, or a multi-bit error in a defective byte position of said data word by processing the same non-zero syndrome byte resulting from exclusive-ORing a write check byte and a read check byte, each bit of said check bytes representing the modulo-2 sum of the binary value of the data bits in different bit positions of said data word during reading and writing respectively, said different bit positions being selected in accordance with a parity check matrix H' which is developed from a parity check matrix H corresponding to an m-sequence having $2^b-1$ columns and b rows by systematically selecting M groups of b columns from said matrix H such that adjacent groups are spaced apart in said H matrix $\lambda$-b columns where $\lambda$ is equal to or greater than b and does not result in two of said M groups having an overlapping relationship;

means for exclusive-ORing said read check character and said write check character to develop said syndrome byte;
a processing circuit for non-zero syndrome bytes, including:
(a) a b stage register for receiving said developed syndrome byte when a non-zero syndrome pattern is present;
(b) a logic block associated with each stage having an output connected to the input of each stage and an input connected to outputs of predetermined stages; and
(c) means to cycle the contents of said register through said associated logic blcks back to said register whereby the pattern of said developed syndrome byte is changed after each cycle in a predetermined manner to a different pattern; and means connected to said cycling means to selectively control the number of cycles taken by said processing circuits depending on whether said developed syndrome byte is being processed for a random single-bit error or a multi-bit error in said defective byte location.

16. The dual function ECC system defined by claim 15 further including first and second check character generators for generating said write check character and said read check character respectively, each said check generator comprising:
a b stage register;
a separate logic block connected to the input of each said stage;
means connecting the outputs of selected stages to said inputs of each said logic block;
means for supplying said data word to said generator serial by byte; and
means for supplying to other inputs of each said logic block data bit signals from each byte during successive cycles, said data bit signals supplied to each said logic block being selected from bit positions of each byte determined by a matrix $T^\lambda$ which is spaced $\lambda$-b columns from the identity matrix of said m-sequence, each said logic block functioning to provide the modulo-2 sum of the signals supplied thereto from said data byte and said register stages during each cycle of operation, whereby after M-1 cycles said check byte is positioned in said b stage register.

17. The generator recited in claim 16 further including means for selectively connecting said means for supplying to one of two separate data word sources, one of which is adapted to store said data word and a previously generated write check byte.

18. The generator recited in claim 17 further including means operable during said Mth cycle to transfer said generated check byte from said register to said one data word source.

19. The combination recited in claim 18 in which said generated check byte is a read check byte and means are provided for transferring said read check byte to a syndrome generating circuit.

20. An error correcting check byte generator for generating a b bit check byte, each bit of which represents the modulo-2 sum of the binary value of the data bits in different bit positions of a data word having M-1 bytes, each of which also consists of b bits, said different bit positions being selected in accordance with a parity check matrix H' which has been developed from a parity check matrix H corresponding to an m-sequence by systematically selecting from said matrix H, M groups of b columns, which groups are spaced λ-b columns apart, where λ is equal to or greater than b and Mλ is less than $2^b$, said generator comprising:

a b stage register;

a separate logic block connected to the input of each said stage;

means connecting the outputs of selected stages to said inputs of each said logic block;

means for supplying said data word to said generator serial by byte; and means for supplying to other inputs of each said logic block data bit signals from each byte during successive cycles, said data bit signals supplied to each said logic block being selected from bit positions of each byte determined by a matrix $T^\lambda$ which is spaced λ-b columns from the identity matrix of said m-sequence, each said logic block functioning to provide the modulo-2 sum of the signals supplied thereto from said data byte and said register stages during each cycle of operation, whereby after M-1 cycles said check byte is positioned in said b stage register.

21. The generator recited in claim 20 further including means for selectively connecting said means for supplying to one of two separate data word sources, one of which is adapted to store said data word and a previously generated write check byte.

22. The generator recited in claim 21 further including means operable during said Mth cycle to transfer said generated check byte from said register to said one data word source.

23. The combination recited in claim 22 in which said generated check byte is a read check byte and means are provided for transferring said read check byte to a syndrome generating circuit.

24. An ECC circuit for processing a dual function non-zero syndrome byte which has been developed by exclusive-ORing a b bit write check character and a b bit read check character to establish either the location of a single random 1-bit error in a data word comprising M byte positions each having b bit positions or the error pattern of a multi-bit error in one predetermined defective byte location of said data word where each bit of each said check character represents the modulo-2 sum of the binary value of the data bits in different positions of said data word, said different positions being prdetermined in accordance with a parity check matrix H' comprising Mb contiguous columns and b rows, said contiguous columns corresponding to M groups of b columns of a parity check matrix H which represents a maximal length shift sequence of length $2^b$-1, the spacing between said successive groups of b contiguous columns in said H matrix being λ-b columns where λ is equal to or greater than b and none of said M groups overlap one another, said circuit comprising:

a b stage register adapted to receive said syndrome byte;

a separate logical block connected to the input of each stage of said register, each block having a plurality of inputs which are summed modulo-2 by said block and stored in said register once each cycle;

means connecting the output of selected stages of said register to said inputs of each said logical block whereby the binary values stored in selected stages of said register at the beginning of said cycle are summed modulo-2 during said cycle and stored in each stage prior to the end of said cycle, the output connections from each said stage to selected logic blocks being predetermined in accordance with a b×b matrix $T^{-\lambda}$ spaced in said sequence −(λ-b) columns from the identity matrix of said sequence; and means to cycle said processing circuit through at least M cycles to determine if said syndrome byte represents a correctable single-bit random error.

25. The combination recited in claim 24 further including logic means connected to the output of said register for providing a control signal when the contents of said register contain a pattern having only a single 1 bit.

26. The combination recited in claim 25 further comprising means responsive to said 1-bit pattern control signal for stopping said means to cycle.

27. The combination recited in claim 26 further comprising means for determining the number of cycles which have occurred in processing said syndrome byte prior to stopping said cycling means, said number being indicative of the byte location in said data word of a single-bit random error and the position of said single 1 in said pattern in said register corresponding to the bit position in said byte location of said single random 1-bit error.

28. The combination recited in claim 24 further including control means for cycling said processing circuit a predetermined number of times less than M related to the position in said data word of a known defective byte location in said data word to cause the error pattern of the data stored in said defective byte location to be developed from said dual function non-zero syndrome byte.

29. The combination recited in claim 28 in which said control means further includes means for cycling said processing circuit until a 1-bit pattern is developed from said dual function syndrome byte and means responsive to the number of cycles for indicating the byte location of said data word having a single 1-bit error.

30. The method of correcting two separate types of errors in a data word having M-1 data byte positions and one check byte position where each of said positions consists of b bit positions as said word is read from a memory having M failure independent units, each of which is associated with the same byte position of successive data words, said method comprising:

generating a syndrome byte S by exclusive-ORing a dual function write check character and a dual function read check character, each said dual function character representing the modulo-2 sum of the value of data bits from bit positions of each byte position of a data word which have been selected in accordance with a parity check matrix H' that has been developed from a parity check matrix H corresponding to an m-sequence of length $2^b$ positions by systematically selecting M groups of b×b submatrices which are spaced in said m-sequence λ-b columns aparat, where λ is equal to or greater than b and Mλ is less than $2^b$;

checking M different columns of said matrix H disposed at λ intervals in said m-sequence from the location of said non-zero syndrome in said m-sequence for any 1-bit pattern; and correcting the 1-bit error in said data word by logically combining said any 1-bit pattern with the data located in a byte position of said data word corresponding to the number of said λ intervals between said positions of said syndrome byte and said any 1-bit pattern in said m-sequence when the number of intervals is M or less, or correcting an error in said data word by logically combining the data byte located at a known defective byte location with a pattern in said m-sequence which is disposed $K\lambda$ columns from the position of said syndrome byte in said m-sequence where K is a function of the known defective byte location.

31. The method recited in claim 30 in which one type of error is a random single 1-bit error in a data word and the other type is a multi-bit error pattern in one byte position of said data word.

32. The method recited in claim 31 further including the steps of generating said dual function write check character as said data word is entered into said memory and the step of generating said dual function read check character as said data word is read out from said memory.

33. The method recited in claim 32 in which said dual function check character generating steps each comprise summing modulo-2 the value of data in bit positions of said data word which are determined by a parity check matrix H' developed from a parity check matrix H corresponding to an m-sequence of length $2^b$ by systematically selecting M groups of $b \times b$ submatrices which are spaced $\lambda$-b columns apart in said parity check matrix H, where $\lambda$ is equal to or greater than b and $M\lambda$ is less than $2^b$.

34. The method of correcting two separate types of errors in a data word having M-1 data byte positions and one check character position where each of said positions consists of b bit positions as said word is read from a memory having M failure independent units, each of which is associated with the same byte position of successive data words, said method comprising:
generating a syndrome byte S by exclusive-ORing a write check character and a read check character;
cycling each said syndrome byte having a non-zero pattern through a predetermined logical operation for at least M cycles to generate a modified syndrome byte;
detecting if said modified syndrome byte comprises a pattern having a single 1 bit after each cycle until M modified syndrome bytes have been generated;
counting the number of cycles said syndrome byte is cycled through said logical operation and correcting the single-bit error in said data word using said detected 1-bit pattern and the number of cycles taken before said 1-bit pattern is detected;
or alternately, correcting either one or both types of said errors by processing said non-zero syndrome byte through said predetermined logical operation a predetermined number of cycles related to the known defective byte location in said data word to generate the correct error pattern.

35. In a dual function error correcting system for correcting either a random single-bit error or a multi-bit error in one byte of a data word by processing one b bit syndrome byte developed by exclusive-ORing one b bit write check byte and one b bit read check byte in which each said data word comprises M-1 data byte positions and one check byte position, each byte position comprising b bit positions;
a method of developing at least one of said check bytes comprising:
(a) generating b binary bit signals during each cycle of an M cycle process where each group of b binary signals corresponds to one data byte of said data word having M byte positions;
(b) combining on a corresponding cyclic basis the values in bit positions of a b bit vector with the values in corresponding bit positions of each byte position, said bit positions of said bit vector being predetermined in accordance with a matrix $T^\lambda$, spaced in an m-sequence of length $2^b-1$, $\lambda$-b columns from the identity matrix of said m-sequence; and
(c) either storing the b bit vector resulting after M-1 cycles as said write check byte or transferring the b bit vector resulting after M-1 cycles to a syndrome generation circuit as said read check byte.

36. The method recited in claim 35 in which the step of combining comprises summing on a modulo-2 basis the binary values in said predetermined bit positions of said b bit vector at the end of one cycle and the values in said bit positions of the data byte generated during the next cycle to produce another b bit vector.

37. In a dual function error correcting system for correcting either a random single-bit error or a multi-bit error in one byte by processing one b bit syndrome byte developed by exclusive-ORing one b bit write check byte and one b bit read check byte in which each said data word comprises M-1 data byte positions and one check byte position and each byte position comprises b bit positions;
a method of developing at least one of said check bytes where each bit of said check byte represents the modulo-2 sum of the binary value of the data bits in different bit positions of said data word, which different said bit positions have been selected in a predetermined systematic manner, said method comprising the following steps:
(a) selecting a $b \times b$ matrix from a $b \times 2^b-1$ matrix corresponding to an m-sequence, said selected $b \times b$ matrix being spaced $\lambda$-b matrix columns from the $b \times b$ identity matrix of said m-sequence, where $\lambda$ is equal to or greater than b and $M\lambda$ is less than $2^b$;
(b) generating a b bit vector where each bit of said vector represents the modulo-2 sum of the binary value of the corresponding bits in the columns of a $b \times b$ matrix which correspond to each said bit position of the 0th byte of said data word which contains a binary 1; and
(c) generating M-1 successive b bit vectors where each bit of each said successive M-1 b bit vector represents the modulo-2 sum of the value of the corresponding bits in columns of said selected matrix which columns are selected by exclusive-ORing the last generated b bit vector with the next data byte until M-1 bytes of data have been sequentially processed, whereby said b bit vector resulting after processing said M-1 bytes of data corresponds to said check character.

* * * * *